United States Patent
Chang

(10) Patent No.: US 9,223,220 B2
(45) Date of Patent: Dec. 29, 2015

(54) PHOTO RESIST BAKING IN LITHOGRAPHY PROCESS

(71) Applicant: Taiwan Semiconductor Manufacturing Company, Ltd., Hsin-Chu (TW)

(72) Inventor: Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 14/189,533

(22) Filed: Feb. 25, 2014

(65) Prior Publication Data

US 2014/0272726 A1 Sep. 18, 2014

Related U.S. Application Data

(60) Provisional application No. 61/778,252, filed on Mar. 12, 2013.

(51) Int. Cl.
*G03F 7/38* (2006.01)
*G03F 7/16* (2006.01)

(52) U.S. Cl.
CPC . *G03F 7/38* (2013.01); *G03F 7/168* (2013.01)

(58) Field of Classification Search
CPC .......... G03F 7/70691; G03F 7/26; G03F 7/38
See application file for complete search history.

(56) References Cited

U.S. PATENT DOCUMENTS

2001/0055731 A1* 12/2001 Irie ............................... 430/313

* cited by examiner

*Primary Examiner* — Kathleen Duda
(74) *Attorney, Agent, or Firm* — Slater & Matsil, L.L.P.

(57) ABSTRACT

A method includes coating a photo resist on a wafer in a first production tool, and performing a pre-exposure baking on the photo resist in a second production tool separate from the first production tool. After the pre-exposure baking, the photo resist is exposed using a lithography mask. After the step of exposing the photo resist, a post-exposure baking is performed on the photo resist. The photo resist is then developed.

20 Claims, 6 Drawing Sheets

PHOTO RESIST BAKING IN LITHOGRAPHY PROCESS

CROSS REFERENCES TO RELATED APPLICATION

This application claims the benefit of the following provisionally filed U.S. Patent application: Application Ser. No. 61/778,252, filed Mar. 12, 2013, and entitled "Photo Resist Baking in Lithography Process;" which application is hereby incorporated herein by reference.

BACKGROUND

In the formation of integrated circuits, the components of the integrated circuits need to be patterned to form desirable shapes. A typical patterning process includes a lithography process, which includes coating a photo resist over a target layer that is to be patterned, exposing the photo resist using a lithography mask, developing the photo resist, and using the developed photo resist to etch the target layer. As a result, the layout of the developed photo resist is transferred to the underlying layer. The photo resist is then removed.

The lithography process may be performed using an inline process or an offline process. In the inline process, all steps of the pattern formation of the photo resist are performed in a same production tool, which pattern formation includes photo resist coating, soft baking, exposing the photo resist, post-exposure baking, and developing the photo resist. In the offline process, the above-recited process steps are separated into different production tools including, for example, a production tool for the photo resist coating and a production tool for the exposure and the development of the photo resist. The wafers with the photo resist coated thereon are transferred between the production tools.

During the transferring, the wafers and the respective photo resist are subject to the effect of various detrimental chemicals, which include airborne amine. The amine will neutralize the photo acid that is generated in the photo resist after exposure. Hence, the amount of photo acid is undesirable reduced. This causes the variation in the dimensions of the features generated by the lithography process. For example, due to the undesirable exposure to amine, the trenches formed using the lithography process is reduced, and the line Critical Dimension (CD) is undesirably increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A lithography process is provided in accordance with various exemplary embodiments. The intermediate stages of the lithography process are illustrated. The variations and the operation process of the embodiments are discussed. Throughout the various views and illustrative embodiments, like reference numbers are used to designate like elements.

Figure 1:
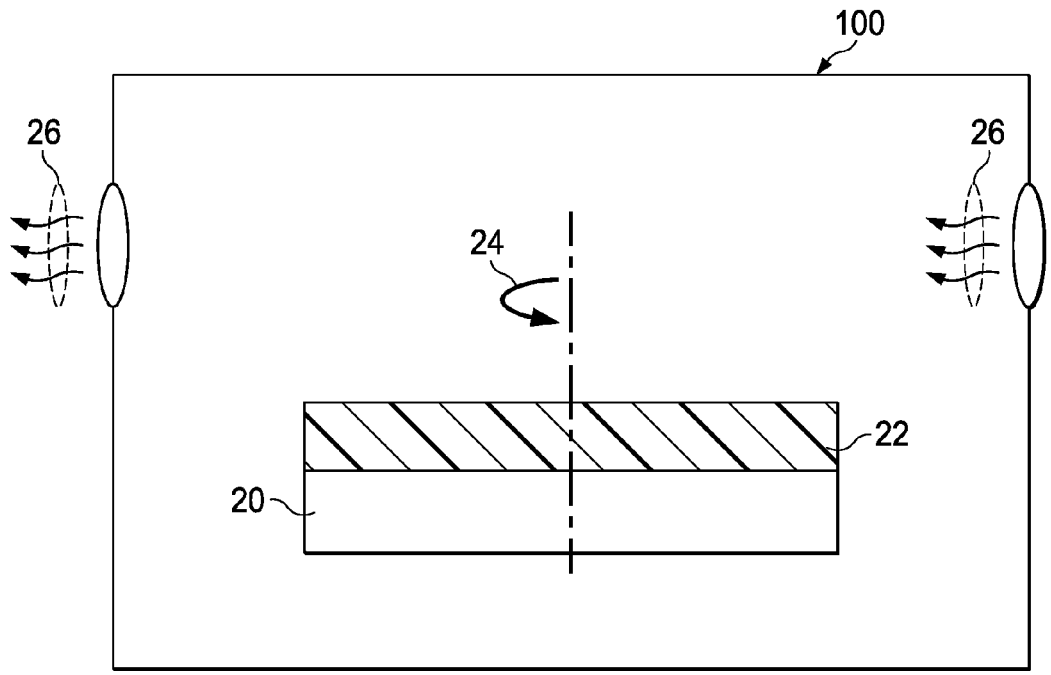
FIGS. 1 through 9 are cross-sectional views of intermediate stages in the formation of patterns in a photo resist in accordance with some exemplary embodiments.

FIGS. 1 through 9 illustrate the cross-sectional views of intermediate stages in the patterning of a photo resist. The patterned photo resist is then used as an etching mask to etch an underlying layer. The process flow of the process shown in FIGS. 1 through 9 is briefly illustrated in the process flow shown in FIG. 10. FIG. 1 illustrates the coating of photo resist 22 on wafer 20, wherein the coating step is illustrated as step 302 in the process flow shown in FIG. 10. In some embodiments, wafer 20 is a semiconductor wafer, and may further be a silicon wafer. In alternative embodiments, wafer 20 is a dielectric wafer, a conductive wafer, or the like. Wafer 20 may include a semiconductor substrate (not shown), and integrated circuit devices (not shown) such as transistors. In addition, wafer 20 may include metal layers (not shown), dielectric layers (not shown), and the like. The details of wafer 20 are not shown herein. In accordance with some embodiments, photo resist 22 is applied on wafer 20 using spin coating, wherein arrow 24 represents the spinning of wafer 20 when photo resist 22 is applied. In accordance with some embodiments, photo resist 22 includes a polymer, a solvent, a quencher, and a Photo Acid Generator (PAG), which is configured to generate a photo acid when exposed to light. In another embodiment, photo resist 22 includes a polymer, a solvent, a light absorption chromo unit, a Thermal Acid Generator (TAG), and a cross linker, which is configured to form a cross link polymer after baking. In yet another embodiment, photo resist layer 22 includes a silicon polymer, a solvent, a light absorption chromo unit. The silicon polymer may condense to form a cross link polymer after baking, which can further form another photo resist layer.

In some embodiments, the photo resist coating is performed in production tool 100. Production tool 100 has a controlled environment, which is filled with the air that has been purified. The air pressure in production tool 100 may be one atmosphere, although the air pressure may be higher or lower than one atmosphere. For example, as in FIG. 1, air 26 that is supplied into production tool 100 is purified, so that the substances that are detrimental to wafer 20 and photo resist 22 are removed from air 26. Production tool 100 is hence substantially free from these detrimental substances. The exemplary detrimental substances include amine, evaporated chemical solvent, moisture, and the like in some embodiments, depending on the structure and the composition of wafer 20 and photo resist 22. Hence, wafer 20 and photo resist 22 are in the environment that is substantially free from amine, for example.

Figure 2:
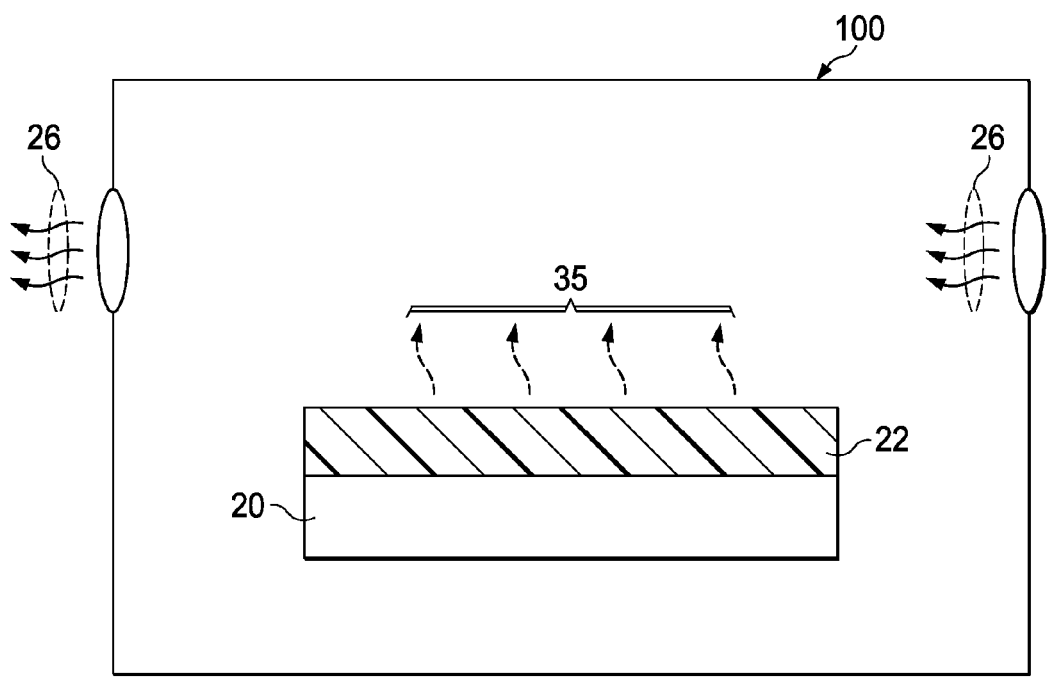

Next, as shown in FIG. 2, a soft baking is performed. The soft baking step is illustrated as step 304 in the process flow shown in FIG. 10. In some embodiments, the soft baking is performed for a period of time between about 60 seconds and about 90 seconds. The temperature of wafer 20 and photo resist 22 may be between about 75° C. and about 135° C., and may also be between about 90° C. and about 110° C. During the soft baking, some substances that are easy to evaporate, such as the solvent therein, are evaporated from photo resist 22, as symbolized by arrow 35. In alternative embodiments, the soft baking step is skipped. Accordingly, in these embodiments, between the step of photo resist coating (FIG. 1) and the step of transporting wafer 20 out of production tool 200 (FIG. 3), no baking step is performed.

In accordance with some embodiments, the photo resist coating step as in FIG. 1 and the soft baking step as in FIG. 2 are performed in the same production tool 100, in which the purified air is provided.

Figure 3:
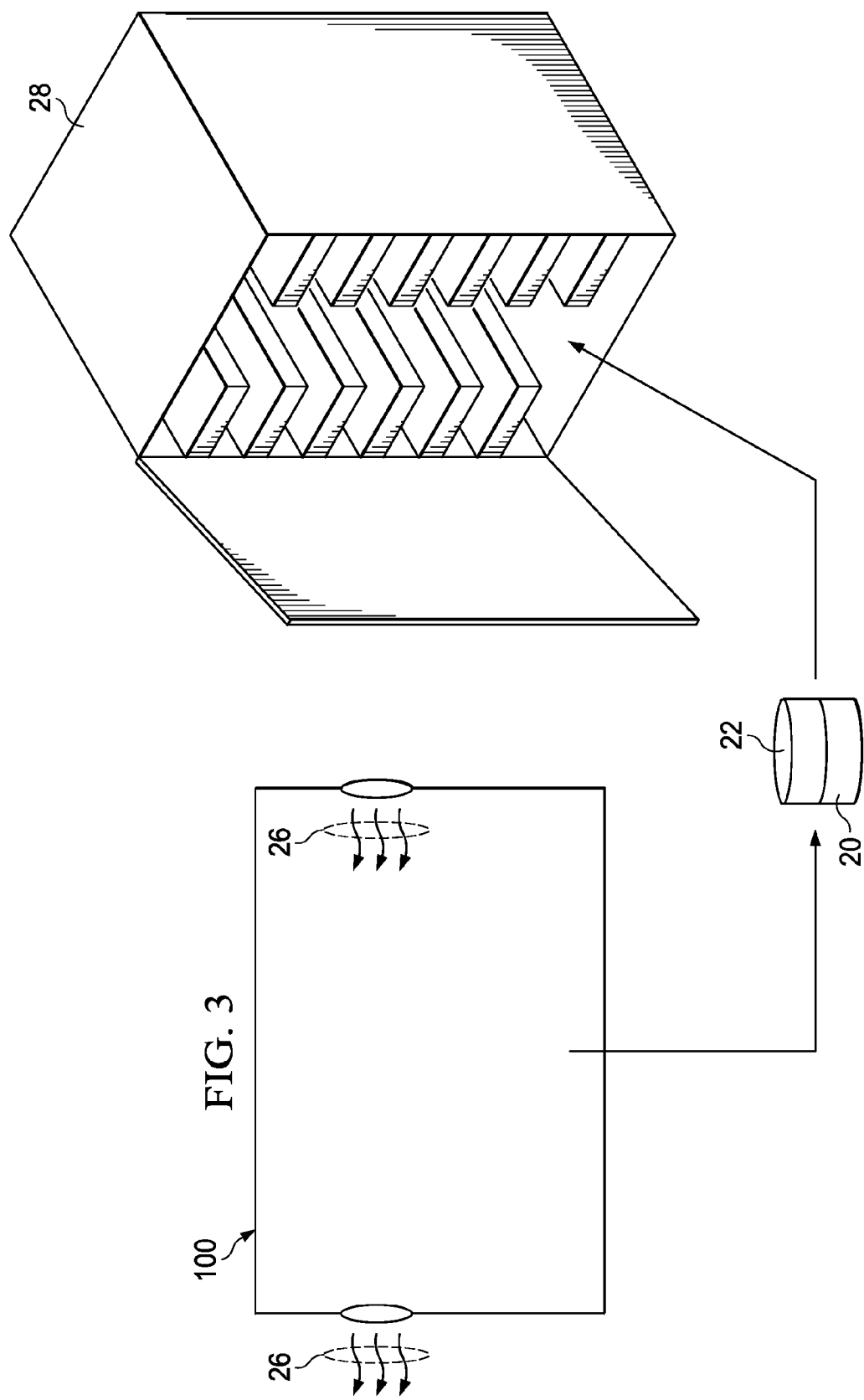
Figure 4:
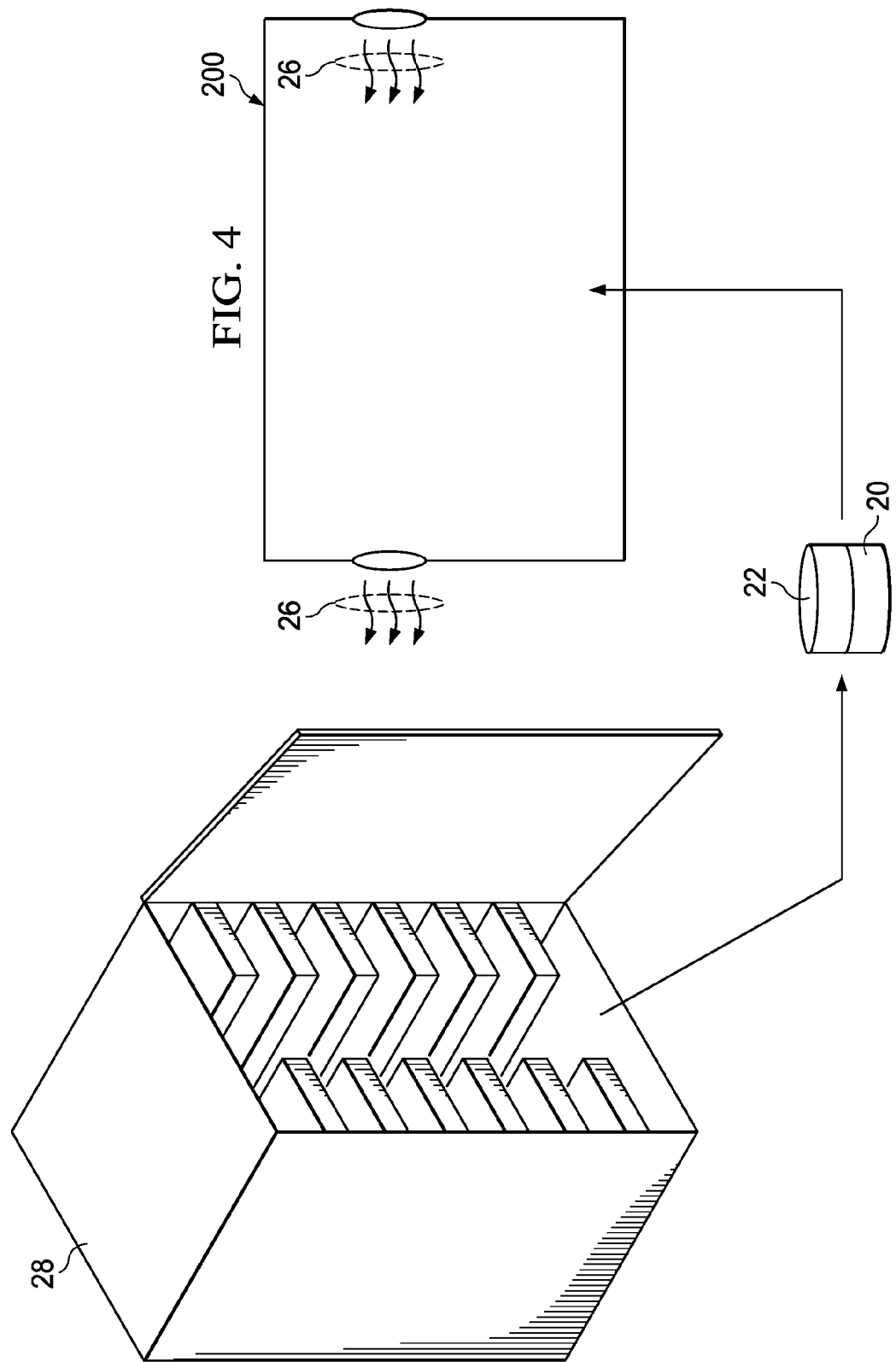
Figure 10:
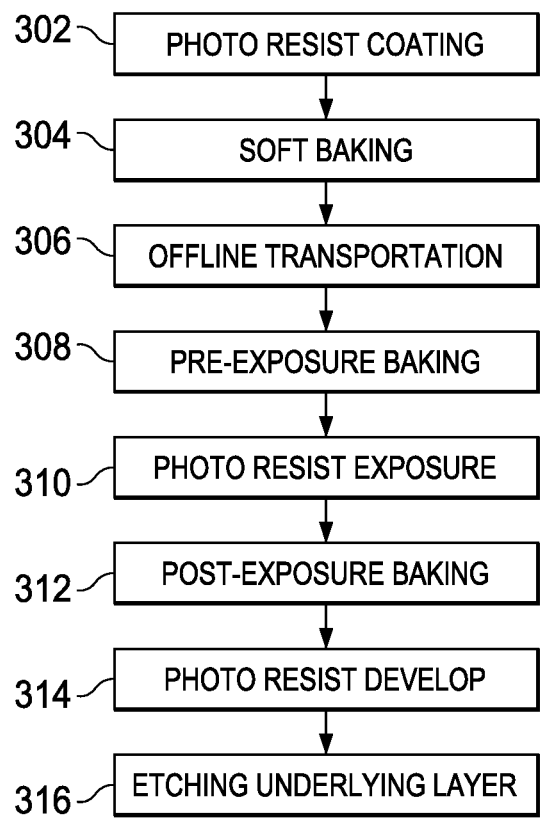
FIG. 10 illustrates a flow chart of a lithography process in accordance with some exemplary embodiments.

FIGS. 3 and 4 illustrate the offline transportation, which is illustrated as step 306 in the process flow shown in FIG. 10. Throughout the description, the term "offline" indicates that during the offline transportation, wafer 20 is transported between different production tools that include purified air. Referring to FIG. 3, wafer 20 (along with the coated photo resist 22) is unloaded from production tool 100, and is placed into wafer storage 28. In some embodiments, wafer storage 28 is a cassette, a Front Opening Unified Pod (FOUP), or the like, which is capable of holding a plurality of wafers. Wafer 20 is then transported, and loaded into production tool 200, as shown in FIG. 4. Production tool 200 and production tool 100 (FIG. 2) may be physically located in different locations. In accordance with some embodiments, during the steps of unloading of wafer 20 from production tool 100, the transportation of wafer 20, and the loading of wafer 20 into production tool 200, wafer 20 is exposed to open air. The open air is not purified, and may include airborne amine, moisture, and/or other substances that are detrimental to photo resist 22 and/or wafer 20. Furthermore, when stored in wafer storage 28, since a plurality of wafers 20 is located close to each other with small distances therebetween, the detrimental substances absorbed by wafers 20 may be released, and absorbed by photo resist 22 of nearby wafers. The duration (referred to as waiting time hereinafter) from the time wafer 20 is unloaded out of production tool 100 and loaded into production tool 200 may range from, for example, 30 minutes to a couple of hours or days. Since the waiting time is adequately long, the amount of the detrimental substances absorbed by photo resist 22 may affect the performance of photo resist 22 to a non-negligible degree.

In accordance with some embodiments, production tool 200 also has a controlled environment, wherein the air (represented by arrows 26) filled therein is purified. The air pressure in production tool 100 may be one atmosphere in some embodiments. The substances that are detrimental to wafer 20 and photo resist 22, which substances include amine, for example, are removed from air 26, and hence production tool 200 is substantially free from the detrimental substances. Therefore, in production tool 200, wafer 20 and photo resist 22 are not exposed to airborne amine.

Figure 5:
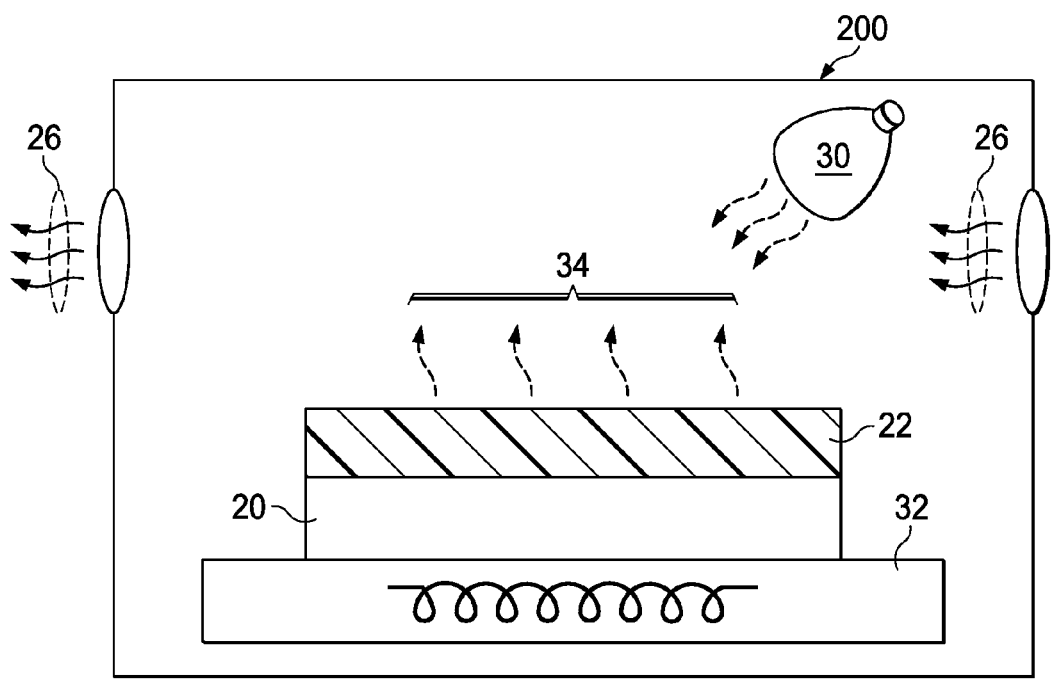

Referring to FIG. 5, a pre-exposure baking is performed on wafer 20. The respective step is shown as step 308 in the process flow shown in FIG. 10. The pre-exposure baking is performed in production tool 200. In accordance with some embodiments, the pre-exposure baking is performed using radiation heater 30, which may an infrared lamp, to heat photo resist 22. Alternatively, other types of radiation sources such as Halogen lamps may be used to heat photo resist 22. The pre-exposure baking may also be performed by heating wafer 20 from its backside, wherein heater 32 may be used. Heater 32 may comprise electrical coils in accordance with some embodiments. The pre-exposure baking may be performed for a period of time between about 30 seconds and about 120 seconds. During the pre-exposure baking, the temperature of wafer 20 and photo resist 22 may be between about 75° C. and about 135° C., and may also be between about 100° C. and about 120° C. During the pre-exposure baking, some detrimental substances that are absorbed by photo resist 22 and wafer 20 are evaporated, as represent by arrows 34, and are evacuated from production tool 200 through the circulation of air 26.

Figure 6:
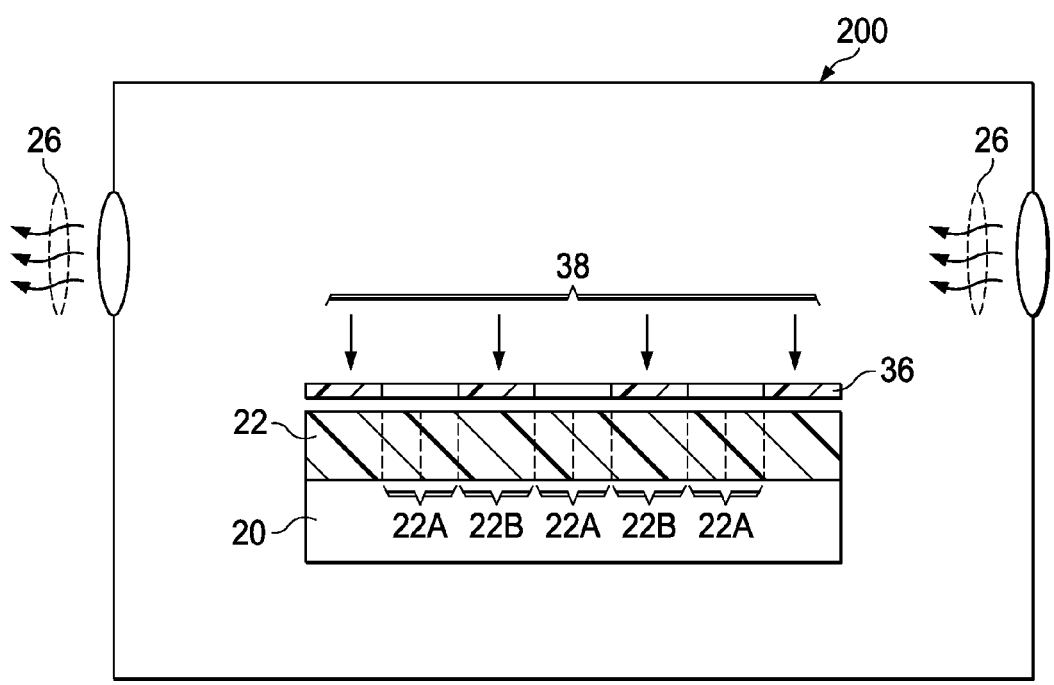

Next, referring to FIG. 6, photo resist 22 is exposed to light. The respective step is shown as step 310 in the process flow shown in FIG. 10. The exposure step is also performed in production tool 200. In some embodiments, lithography mask 36 is used, which may be a glass plate including transparent patterns and opaque patterns formed thereon. Lithography mask 36 comprises the patterns that are to be transferred to photo resist 22. Light 38 is projected onto lithography mask 36. The opaque patterns block light 38, while the transparent patterns allow light 38 to pass through. As a result, portions 22A of photo resist 22 are exposed by light 38, and portions 22B are not exposed. Photo acid is generated from the PAC or PAG in photo resist 22 when the PAC or PAG is exposed to light. In an Extreme Ultraviolet (EUV) or an E-beam system, the photo acid is generated from the PAC or PAG when the PAC or PAG is transferred (excited) when exposed to EUV light or electron beam, which provides the energy for the transferring. On the other hand, in portions 22B, which are not exposed to light, no photo acid is generated.

Figure 7:
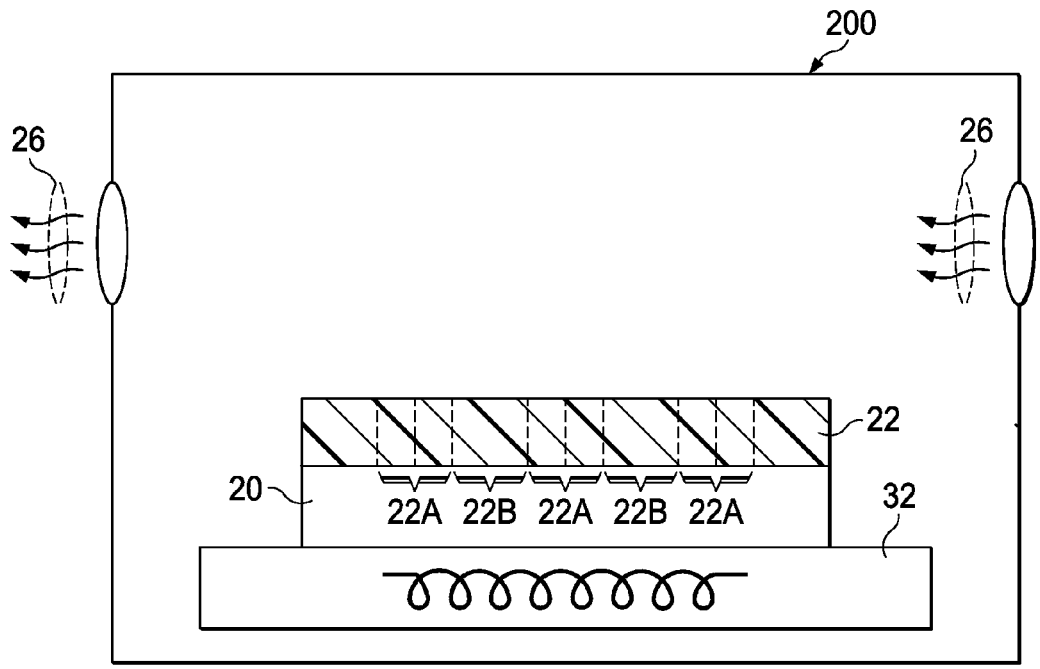

In FIG. 7, a post-exposure baking step is performed. The post-exposure baking step may also be performed in production tool 200 in accordance with some embodiments. The respective step is shown as step 312 in the process flow shown in FIG. 10. In accordance with some embodiments, the post-exposure baking is performed for a period of time between about 60 seconds and about 90 seconds. The temperature of wafer 20 and photo resist 22 may be between about 80° C. and about 120° C. As a result of the post-exposure baking, the polarity of the polymer in the exposed portions 22A of photo resist 22 is changed due to the existence of the photo acid generated in the exposure. Conversely, the polarity of the polymer in the un-exposed portions 22B is not changed due to the non-existence of the photo acid. Accordingly, the characteristics of portions 22A and 22B are different from each other.

Figure 8:
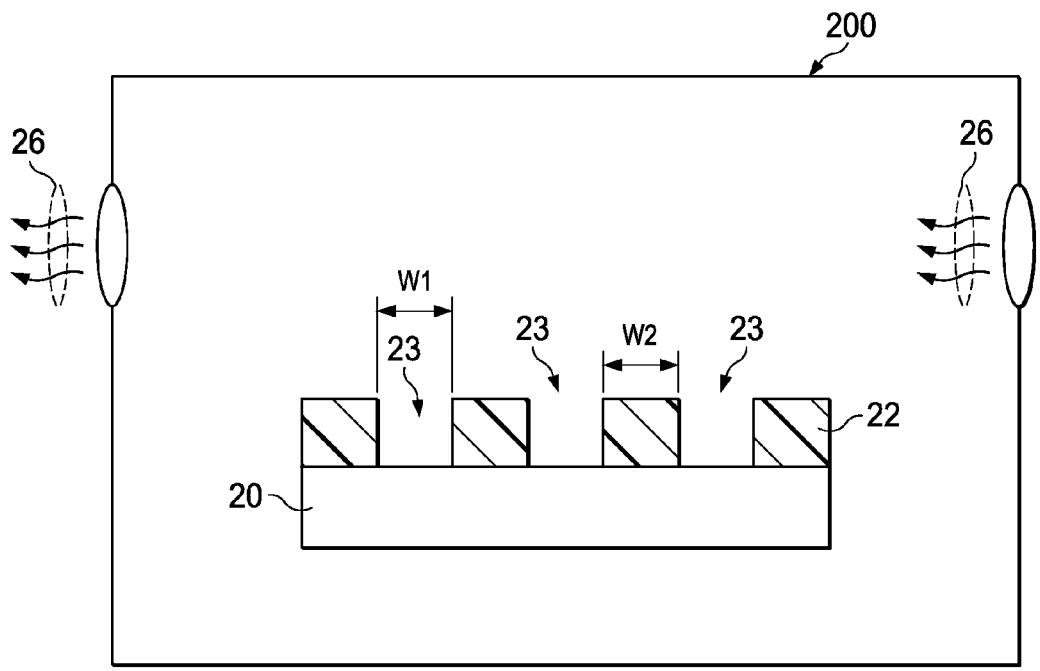

FIG. 8 illustrates the development of photo resist 22. The respective step is shown as step 314 in the process flow in FIG. 10. In some embodiments, the pre-exposure baking, the photo resist exposure, the post-exposure baking, and the photo resist development are performed in the same production tool 200. During and between these steps, wafer 20 is not retrieved out of production tool 200. Accordingly, during the entire period of time from the pre-exposure baking is started to the photo resist development is finished, photo resist 22 is not exposed to open air, and no more amine is absorbed into photo resist 22. Furthermore, the pre-exposure baking is performed in the same production tool as the exposure and the development step. Therefore, after the undesirable amine is removed from photo resist 22, since there is no more airborne amine, no more amine is absorbed by photo resist 22.

Since the characteristics of portions 22A and 22B are different, the exposed portions 22A of photo resist 22 are removed by the development step, while portions 22B of photo resist 22 remain. The selectivity in the removal of portions 22A and 22B (which are intended not to be removed) is related to the amount of photo acid in portions 22A. The amine (if any) in photo resist 22, however, may adversely neutralize the photo acid in portions 22A, resulting in some exposed portions 22A of photo resist 22 not removed cleanly. This causes the reduction in the trench width W1 of trenches 23 and the increase in the line width W2 of the lines formed of photo resist 22. In the embodiments of the present disclosure, by performing the pre-exposure baking, the amine that is absorbed into photo resist 22 in transportation step 306 (FIG. 10) is evaporated from photo resist 22, and hence the amount of amine, which neutralizes the photo acid, is reduced in photo resist 22.

Figure 9:
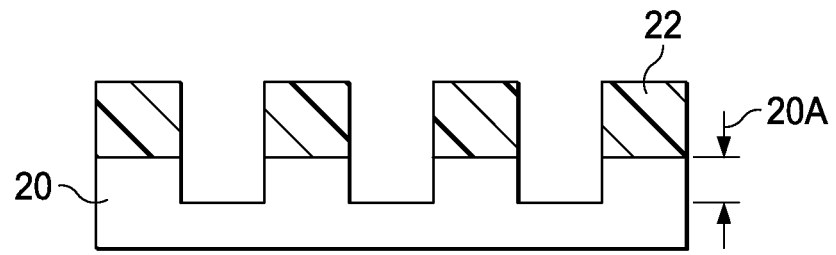

FIG. 9 illustrates the etching of wafer 20 using the patterned photo resist 22 as an etching mask. The etched layer of wafer 20 is illustrated as layer 20A, which layer may be a semiconductor substrate, an inorganic middle layer, an organic under layer, a hard mask layer, a dielectric layer, a metal layer, or the like in accordance with some embodiments.

Table 1 illustrates the effect of the embodiments of the present disclosure.

TABLE 1

| | Pitch | 60 s Soft Baking with No Pre-Exposure Baking | 30 s Soft Baking with 30 s Pre-Exposure Baking | 60 s Pre-Exposure Bake with no Soft Baking |
|---|---|---|---|---|
| Trench Width Drift Rate | Dense Pitch | 1.6 nm/Hour | 0.1 nm/Hour | 0.07 nm/Hour |
| | Iso Pitch | 2.1 nm/Hour | 0.2 nm/Hour | 0.18 nm/Hour |
| Line Width Drift Rate | Dense Pitch | 0.9 nm/Hour | 0.1 nm/Hour | 0.03 nm/Hour |
| | Iso Pitch | 1.3 nm/Hour | 0.2 nm/Hour | 0.08 nm/Hour |

In Table 1, the values represent the drift rates, which mean how much the sizes of the features (such as trenches 23 in FIG. 8) drift with the lapse of time. The term "Trench width" represents the trench width W1 of the trenches 23 in photo resist 22 (FIG. 8), and the term "line width" represents the line width W2 of the lines of photo resist 22. The term "dense pitch" indicates that the related values are obtained from pattern-dense regions in which the patterns of the respective features (trenches or lines) are relatively dense. The term "iso pitch" indicates that the related values are obtained from pattern-sparse regions in which the pattern of the respective features (trenches or lines) are relatively sparse (isolated, or "Iso"). The results indicate that when 60 seconds soft baking is performed and no pre-exposure baking is performed, the trench width drift rates range between about 1.6 nm/hour and about 2.1 nm/hour, and the line width drift rates range between about 0.9 nm/hour and about 1.3 nm/hour. When a soft baking (for 30 seconds) is performed and a pre-exposure baking (for 30 seconds) is performed, the trench width drift rates and line width drift rates drop to about 0.1 nm/hour and about 0.2 nm/hour. When no soft baking is performed and a pre-exposure soft baking (for 60 seconds) is performed, the trench width drift rates and line width drift rates are further dropped. Table 1 hence clearly shows the effect of pre-exposure baking to the drift rate of trenches and lines. Furthermore, Table 1 shows that pre-exposure baking is better than the soft baking in reducing the drifts of the trench widths and the line widths of the photo resist.

In the embodiments of the present disclosure, by performing a pre-exposure baking to remove the amine absorbed in the photo resist, the detrimental effects of amine to the photo resist is reduced, and may be substantially eliminated. The embodiments is particular effective in the offline photo resist formation, in which the photo resist is more like to be exposed to amine.

In accordance with some embodiments, a method includes coating a photo resist on a wafer in a first production tool, and performing a pre-exposure baking on the photo resist in a second production tool separate from the first production tool. After the pre-exposure baking, the photo resist is exposed using a lithography mask. After the step of exposing the photo resist, a post-exposure baking is performed on the photo resist. The photo resist is then developed.

In accordance with other embodiments, a method includes coating a photo resist on a wafer in a first production tool, and transporting the wafer along with the photo resist to a second production tool. Each of the first production tool and the second production tool is filled with purified air, with amine removed from the purified air. The method further includes performing a pre-exposure baking on the photo resist, exposing the photo resist using a lithography mask, performing a post-exposure baking on the photo resist, and developing the photo resist. The pre-exposure baking, the step of exposing the photo resist, the post-exposure baking, and the step of developing the photo resist are performed in the second production tool.

In accordance with yet other embodiments, a method includes coating a photo resist on a wafer, performing a soft baking on the photo resist, and performing a pre-exposure baking on the photo resist after the soft baking. The soft baking and the pre-exposure baking are separate baking steps separated by a waiting time, with the photo resist not baked during the waiting time. After the pre-exposure baking, the photo resist is exposed to light. After the step of exposing the photo resist, a post-exposure baking is performed on the photo resist. The photo resist is developed to remove exposed portions of the photo resist.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
coating a photo resist on a wafer in a first production tool, wherein the first production tool is filled with purified air substantially free from amine;
performing a pre-exposure baking on the photo resist in a second production tool separate from the first production tool;
after the pre-exposure baking, exposing the photo resist using a lithography mask;
after the step of exposing the photo resist, performing a post-exposure baking on the photo resist; and
developing the photo resist.

2. The method of claim 1, wherein the second production tool is filled with purified air substantially free from amine.

3. The method of claim 1, wherein the step of exposing the photo resist, the post-exposure baking, and the step of developing the photo resist are performed in the second production tool, and wherein during an entirety of time period from the pre-exposure baking is started to the step of developing the photo resist is ended, the photo resist is not exposed to unpurified air.

4. The method of claim 1, wherein the method further comprises transporting the wafer from the first production tool to the second production tool, and wherein during the step of transporting, the wafer is exposed to unpurified air.

5. The method of claim 1 further comprising purifying air, and supplying purified air to each of the first production tool and the second production tool, and wherein the first production tool and the second production tool are separated from each other by open air.

6. The method of claim 1, wherein the pre-exposure baking is performed for a period of time between about 30 seconds and about 120 seconds, and wherein during the pre-exposure baking, the photo resist is at a temperature between about 75° C. and about 135° C.

7. The method of claim 1, wherein during the coating the photo resist, the first production tool has a pressure equal to or higher than one atmosphere.

8. A method comprising:
coating a photo resist on a wafer in a first production tool;
transporting the wafer along with the photo resist to a second production tool, wherein each of the first production tool and the second production tool is filled with purified air with a pressure equal to or higher than one atmosphere, with amine removed from the purified air;
performing a pre-exposure baking on the photo resist;
exposing the photo resist using a lithography mask;
performing a post-exposure baking on the photo resist; and
developing the photo resist, wherein the pre-exposure baking, the step of exposing the photo resist, the post-exposure baking, and the step of developing the photo resist are performed in the second production tool.

9. The method of claim 8, wherein during an entire period of time starting from a first time point the pre-exposure baking is started and ending at a second time point the step of developing the photo resist is ended, the photo resist and the wafer are isolated from unpurified air.

10. The method of claim 8 further comprising performing a soft baking on the photo resist in the first production tool, wherein the wafer is transported to the second production tool after the soft baking.

11. The method of claim 10, wherein the a soft baking is performed for a period of time between about 60 seconds and about 90 seconds, and wherein during the pre-exposure baking, the photo resist is at a temperature between about 110° C. and about 120° C.

12. The method of claim 8, wherein during the step of transporting, the wafer is exposed to unpurified air.

13. The method of claim 8, wherein the pre-exposure baking is performed for a period of time between about 30 seconds and about 120 seconds, and wherein during the pre-exposure baking, the photo resist is at a temperature between about 110° C. and about 120° C.

14. The method of claim 8, wherein during an entire period of time starting from a first time point the pre-exposure baking is started and ending at a second time point the step of developing the photo resist is ended, the photo resist and the wafer are not exposed to unpurified air.

15. A method comprising:
coating a photo resist on a wafer;
performing a soft baking on the photo resist;
after the soft baking, performing a pre-exposure baking on the photo resist, wherein the soft baking and the pre-exposure baking are separate baking steps separated by a waiting time, with the photo resist not baked during the waiting time;
after the pre-exposure baking, exposing the photo resist to light;
after the step of exposing the photo resist, performing a post-exposure baking on the photo resist; and
developing the photo resist to remove exposed portions of the photo resist.

16. The method of claim 15, wherein the step of coating the photo resist and the soft baking are performed in a first production tool, the steps of pre-exposure baking, exposing the photo resist, the post-exposure baking, and the step of developing the photo resist are performed in a second production tool separate from the first production tool, and wherein each of the first production tool and the second production tool is filled with purified air with a pressure equal to one atmosphere.

17. The method of claim 16, wherein the first production tool and the second production tool are physically separated from each other.

18. The method of claim 16 further comprising transporting the wafer and the photo resist from the first production tool to the second production tool, wherein during the step of transporting, the wafer is exposed to unpurified air.

19. The method of claim 15, wherein the soft baking is performed for a period of time between about 60 seconds and about 90 seconds, and wherein during the soft baking, the photo resist is at a temperature between about 110° C. and about 120° C.

20. The method of claim 15, wherein the pre-exposure baking is performed in purified air at a pressure equal to one atmosphere, with amine removed from the purified air.

* * * * *